United States Patent [19]

Dannels

[11] Patent Number: 5,311,133
[45] Date of Patent: May 10, 1994

[54] CONCURRENT GENERATION OF MULTIPLE IMAGES IN FAST (TR<T2) SCANNING SEQUENCES

[75] Inventor: Wayne R. Dannels, Richmond Heights, Ohio

[73] Assignee: Picker International, Inc., Highland Hts., Ohio

[21] Appl. No.: 957,616

[22] Filed: Oct. 5, 1992

[51] Int. Cl.$^5$ .............................................. G01V 3/00
[52] U.S. Cl. .................................... 324/309; 324/307
[58] Field of Search ............... 324/309, 307, 306, 310, 324/311, 314; 128/653.2, 653.3

[56] References Cited

U.S. PATENT DOCUMENTS

| | | | |
|---|---|---|---|
| 4,707,658 | 11/1987 | Frahm et al. | 324/309 |
| 4,795,978 | 1/1989 | Zur et al. | 324/309 |
| 4,940,941 | 7/1990 | Rzedzian | 324/309 |
| 5,034,694 | 7/1991 | Sattin et al. | 324/309 |
| 5,055,790 | 10/1991 | Siuciak et al. | 324/309 |
| 5,241,271 | 8/1993 | Taguchi et al. | 324/309 |

OTHER PUBLICATIONS

"Analysis of the Higher-Order Echoes in SSFP", Kim et al., Magnetic Resonance In Medicine, 19, 20-30 (1991) (no month).

"Multiple Echo SSFP Sequences", Mizumoto, et al., Magnetic Resonance In Medicine, 18, 244-250 (1991) (no month).

"Motion-Insensitive, Steady-State Free Precession Imaging", Zur, et al. Magnetic Resonance in Medicine, 16, 444-459 (1990) (no month).

"Steady-State Free Precession Imaging in the Presence of Motion: Application For Improved Visualization of the Cerebrospinal Fluid", Haacke, et al. Radiology 1990; 175: 545-552 (no month).

"Elimination of Trnsverse Coherences in FLASH MRI", Crawley, et al. Magnetic Resonance In Medicine, 8, 248-260 (1988) (no month).

"Fast SSFP Gradient Echo Sequence for Simultaneous Acquisitions of FID and Echo Signals", Lee, et al., Magnetic Resonance In Medicine, 8, 142-150 (1988) (no month).

"A New Steady-State Imaging Sequence for Simultaneous Acquisition of Two MR Images with Clearly Different Contrasts", Bruder, et al. Magnetic Resonance In Medicine, 7, 35-42 (1988) (no month).

(List continued on next page.)

*Primary Examiner*—Louis Arana
*Attorney, Agent, or Firm*—Fay, Sharpe, Beall, Fagan, Minnich & McKee

[57] ABSTRACT

In a fast scanning technique in which the repeat time TR is less than the T2 relaxation time, a first generation component (34), a second generation component (52), and a third generation component (62) are each phase encoded by a phase encode gradient (36). The persisting second and third generation components are encoded with the sum of the phases with which they have been encoded in the present and prior repetitions. A composite data line is sampled during each echo and includes a first component (44), a second component (54), and a third component (64), each component having an independent phase encoding. The data lines are each stored in a first data set memory (80) in accordance with the phase encoding of the first generation component, in a second data set memory (82) in accordance with the phase encoding of the second component and in a third data set memory means (84) in accordance with the phase encoding of the third generation component. Each of these data sets is filtered (110), transformed (112) into a magnitude image (114) and phase image (116). The magnitude and phase images are filtered (120, 122) and reverse transformed (126) back into a filtered data set (128) and weighted (130) to form an estimate of one component of the other data sets. The estimate is subtracted (138, 140) from the other data sets. This process is iteratively repeated until each data set contains substantially only the data of one component. Each data set is then reconstructed (98) into a separate image representation.

22 Claims, 4 Drawing Sheets

OTHER PUBLICATIONS

"FADE-A New Fast Imaging Sequence", Redpath, et al., Magnetic Resonance In Medicine, 6, 224-234 (1988) (no month).

"Multiecho Imaging Sequences with Low Refocusing Flip Angles", Hennig, Journal of Magnetic Resonance, 78, 397-407 (1988) (no month).

"Fast Field Echo Imaging: An Overview and Contrast Calculations", van der Meulen, et al. Magnetic Resonance Imaging, vol. 6, pp. 355-368, 1988 (no month).

"Steady-State Magnetizations in Rapid NMR Imaging Using Small Flip Angles and Short Repetition Intervals", Sekihara, IEEE Transactions on Medical Imaging, vol. MI-6, No. 2, Jun. 1987.

"FLASH Imaging, Rapid NMR Imaging Using Low Flip-Angle Pulses", Haase, et al. Journal of Magnetic Resonance, 67, 258-266 (1986) (no month).

"Very Fast MR Imaging by Field Echoes and Small Angle Excitation", van der Meulen, et al., Magnetic Resonance Imaging, vol. 3, pp. 297-299, 1985 (no month).

"Diffusion and Field-Gradient Effects in NMR Fourier Spectroscopy", Kaiser The Journal of Chemical Physics, vol. 60, No. 8, Apr. 15, 1974 pp. 2966-2979.

"Effects of Diffusion in Nuclear Magnetic Resonance Spin-Echo Experiments", Woessner, The Journal of Chemical Physics, Vo. 34, No. 6, Jun. 1961, pp. 2057-2061.

CONCURRENT GENERATION OF MULTIPLE IMAGES IN FAST (TR<T2) SCANNING SEQUENCES

BACKGROUND OF THE INVENTION

The present invention relates to fast scanning magnetic resonance imaging. It finds particular application in conjunction with medical diagnostic imaging procedures in which data is concurrently acquired for multiple images with different T1/T2 weightings and will be described with particular reference thereto. However, it is to be appreciated, that the invention will also find application in conjunction with fast scanning sequences for generating a single image and for non-medical applications.

In many magnetic resonance imaging sequences, the repeat time TR is selected to be substantially longer than the T2 relaxation time of the material being imaged. This permits the transverse magnetization which is excited in each repetition of the sequence to die out before the next repetition, of course, if the repeat time is shortened, then the time required to collect a full set of data is shortened proportionately. However, when the repeat time is shortened to be comparable to or less than the T2 relaxation time, transverse magnetization excited in one repetition persists or carries over into the next repetition.

Various fast scanning sequences have been developed in which the repetition time TR is less than the T2 relaxation time of the material being imaged. In each repetition of the sequence, there is a freshly excited or first generation resonance signal component and older persisting (second and higher generation) residual magnetization signal components which carry over from the preceding one or more repetitions. When the freshly excited and persisting residual resonance magnetization signal components are allowed to coincide, the resultant images are difficult to interpret. The different signal components have had different amounts of time (TE) in which the signal may decay, and thus one cannot expect to see the typical contrast associated with any one TE. Worse yet, the residual signal components have different histories of phase evolution than the freshly excited component. In particular, the different histories involve different phase accumulation, and so the residual components may not reconstruct properly at all, or they may reconstruct with minor phase errors causing them in some places to add constructively to the main component, and in other places to add destructively.

One can run a generic field echo scan with a very short TR and with a small flip angle. The freshly excited and residual signals from several repetitions can be permitted to overlap without expressly worrying about alignment in the time of the echoes, refocusing phase echoes, or inducing dephasing. In this manner, the freshly excited and residual magnetization signals add together to produce a stronger resonance signal for imaging. However, this technique is prone to serious banding artifacts and interference patterns. Because the single resultant image is actually a complicated superposition of images, its contrast is hard to interpret.

In one technique for improving the resultant images, untwisting or phase decoding gradients are applied at the end of each repetition to erase the phase history of the residual components. In this manner, the residual magnetization and the freshly excited magnetization signal components have the same phase encoding. When the residual and freshly excited magnetization signal components are caused to refocus concurrently into echoes, their contributions add improving the signal-to-noise ratio. This enables a steady-state to be reached in which the magnetization in each repetition has the same ratio of freshly excited to residual signal, one of the drawbacks to this technique is that it is prone to banding artifacts and has a complicated contrast. A source of the banding is phase dispersion from static field inhomogeneities, chemical shift, motion, or the like, which are phase-producing mechanisms not compensated for by the phase untwisting gradient waveforms.

Another approach is to spoil the residual signal from the preceding cycles. A constant gradient section is used in each repetition that is not refocused. This spoils the residual signal components and averages the phase dispersion within each voxel. The image intensity of a steady-state type scan varies as a function of the evolving phase dispersion. However, this evolving dispersion effect is reduced or eliminated by causing each voxel to contain one complete cycle of phase variation or an integer number of phase wraps. Leaving a constant amount of gradient without rephasing in each repetition interval insures that all voxels exhibit a comparable, average phase dispersion. However, this technique may still yield some banding artifacts and striping. It does not make use of all available signal. Rather, the signal-to-noise of the total scan is lower than other techniques described above.

Another technique is to spoil the residual magnetization signal components with varying gradients. When the amplitude of the spoiling gradient is altered from repetition to repetition, a spoiling effect is achieved under conditions where constant amplitude spoiler gradients would just cancel out. The spoiler gradients are applied along coherency pathways with RF spin echoes or with RF stimulated echoes. The spoiler gradients either increase progressively in steps with each repetition or alternate polarity. However, these techniques do not make use of the total available signal. Stepping the spoilers over long ranges which do not repeat is impractical, especially with shorter repetitions. Often the hardware to support large gradients is not available. Stepping spoiler gradients through short patterns breaks up the shorter coherence pathways but allows longer RF echoes to be refocused. Using large sections of gradients which alter significantly from repetition to repetition may induce detrimental gradient eddy current effects which distort images and destroy steady-state effects.

There is a class of techniques in which the RF pulse is modified from repetition to repetition. The phase modification is used in one of several ways to reduce artifacts. For example, the phase of the RF pulse is indexed in steps which vary throughout the duration of the scan. In another technique, two scans are taken. In one scan, the RF phase is held constant and in the other the RF phase is alternated. The images obtained from two scans are selectively combined such that regions of one image with banding artifacts are replaced with artifact-free portions of the other image. In another related technique, the RF transmit phases are stepped and different transforms are performed to separate the various echoes. The other RF modified techniques also have the disadvantage of requiring longer scan times, or the disadvantage of greatly reducing resolution to achieve the same short total scan time. In the first technique in which the phase step varies, less than all of the total available signal strength is used. Although this technique reduces artifacts, residual artifacts are still found.

In other techniques, the residual and freshly excited signal components are caused to generate echoes which are offset in time. In this manner, the echoes from each component occur one after the other and are acquired in succession. This enables the data from each echo to be handled separately to generate multiple images or a single image which is free of residual magnetization contribution. However, because numerous echoes occur in a very short interval, the sampling time accorded for each is relatively small. This small sampling window decreases the signal-to-noise. Moreover, for a given resolution and a given field of view, more total gradients are required (particularly the read gradient) than in the other methods discussed above. In order to be practiced on currently available scanners, it is normally necessary to compromise either the repeat time, the resolution, or the field of view.

The present invention contemplates a new fast scanning technique which overcomes the above-referenced problems and others while generating one or more artifact reduced images.

SUMMARY OF THE INVENTION

In accordance with the present invention, a fast scanning technique is provided in which the freshly excited and one or more residual magnetic resonance signal components are independently phase encoded. The independent phase encoding enables the signal components to be superimposed and acquired simultaneously, yet separated and reconstructed with relative independence from each other.

More specifically to the preferred embodiment, a phase encoding gradient is applied in each repetition in such a manner that the freshly excited first generation magnetization component is phase encoded with a freshly applied phase encode gradient and the residual signals are phase encoded with the sum of the freshly applied and previous phase encodings.

In accordance with another aspect of the present invention, the phase encoding gradients are selected such that the central views of one of the first generation and residual image(s) occur concurrently with peripherally phase encoded views of the other image (s). Each of the views is stored in a plurality of data space memories, but in the data location corresponding to different phase encodings. That is, in the collected signal, the phase encoding of the first generation signal component is known and the data line is stored as the corresponding phase encoded data line in a first generation image data space memory; the phase encoding of the residual second generation signal component is known and the same data line is stored as the data line with that phase encoding in a second generation residual image data space memory; and so forth for third, fourth, and later generation residual signal components.

In accordance with another aspect of the present invention, the magnetic resonance data corresponding to each generation is separately reconstructed. Because the centrally phase encoded views contribute most strongly to the resultant image, each reconstructed image corresponds primarily to one of the freshly excited, first generation signal, the second generation residual signal, the third generation residual signal, etc.

In this manner, a plurality of images is generated. Although each image contains contributions from generations of signals, each image weights one generation of signals more heavily.

In accordance with another more limited aspect of the present invention, each image is used to "correct" the other image. More specifically, each image is filtered or processed to emphasize a single generation of the data and then used to remove that generation's image data from the other images. Yet more specifically to the preferred embodiment, an iterative process is performed in which each image is used to reduce the corresponding components of the other and the improved other image is used to reduce its components in the first.

In accordance with a specific implementation of the present invention, a selective RF excitation is applied with a fully refocused slice selection gradient. A primary phase encoding gradient is applied, which in subsequent repetitions is stepped through the series of amplitudes or steps, e.g. 256 steps, in a permuted rather than a sequential order. A composite signal is sampled in the presence of a read gradient which is fully refocused during the repeat interval. This sequence is repeated for the plurality of phase encode steps. The acquired data lines each have overlapping signal components, but each component with a different effective cumulative phase encoding. The data lines are distributed by image and by the phase encoding corresponding to each image and Fourier transformed separately into images. Thus, each data line contributes to each image, but as the data line for a different phase encoding step. An iterative processing step is performed in which the contributions to each signal component for each of the images are estimated and stripped out such that each image is progressively weighted more heavily to a selected one of the components with less noise and artifacts from the other data.

One advantage of the present invention is that multiple images can be generated without increasing the data acquisition time or the sampling bandwidth.

Another advantage of the present invention is that the "bleed through" or residual signal from prior repetitions is used to generate separate, more heavily T2 weighted images.

Another advantage of the present invention resides in a simplification of the hardware. Particularly, the hardware for generating large spoiler gradients is unnecessary.

Another advantage of the present invention resides in its short data acquisition time. Repetition times under 10 milliseconds are readily attainable.

Another advantage of the present invention is that it is applicable to sequences with very low RF flip angles. Low RF flip angles are advantageous due to (1) an increase in total signal strength, commonly described as the "Ernst angle effect"; (2) less T1 weighting to compete with (confuse the interpretation of) the T2 weighting; (3) less saturation from the imaging RF pulses, particularly with additional RF pulses in time-of-flight and presaturation techniques; and (4) less power deposition and resultant heating in the object being scanned, i.e. the human patient.

Another advantage of the present invention resides in its improved signal-to-noise ratio.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
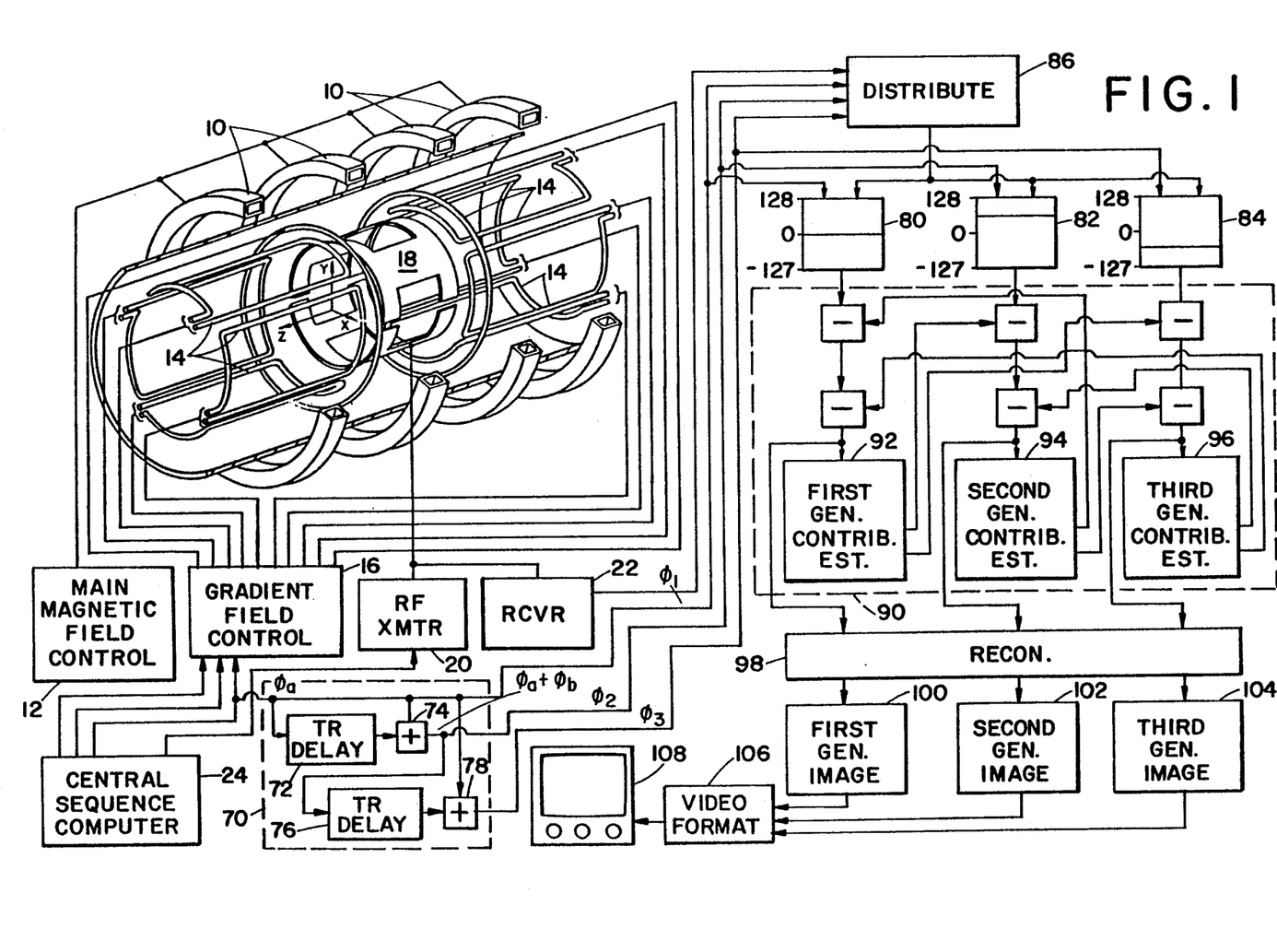
FIG. 1 is a diagrammatic illustration of an MRI scanner in accordance with the present invention.

With reference to FIG. 1, magnets 10 under the control of a main magnetic field control means 12 generate a generally uniform, primary magnetic field through an image region. Gradient coils 14 convert electrical current pulses from a gradient field control 16 into magnetic field gradients across the primary magnetic field. More specifically, the gradient field control includes means for applying gradients along three orthogonal axes, commonly denoted as x, y, and z-axes. As described in greater detail below, these gradients are utilized as slice select gradients, read gradients, and phase encode gradients. Radio frequency (RF) resonance excitation and manipulation pulses are transmitted into the examination region by a radio frequency coil 1a. An RF generator or transmitter means 20 formats RF pulses with selected magnitudes and frequencies to cause magnetization of selected dipoles in the imaging region to be tipped with selected tip angles. As described in greater detail below, the radio frequency transmitter means includes means for generating low tip angle RF excitation pulses, refocusing pulses, and the like.

Magnetic resonance signals emanating from the subject in the examination region are picked up by the RF coil 18 or by surface or supplemental pick up coils (not shown) and conveyed to a radio frequency receiver 22. The radio frequency receiver, preferably a digital receiver, demodulates the resonance signal and generates a digital data line or view from each magnetic resonance echo. An image sequence computer or control means 24 controls the gradient field control 16 and the RF transmitter 20 to generate RF resonance excitation and gradient pulses.

Figure 2:
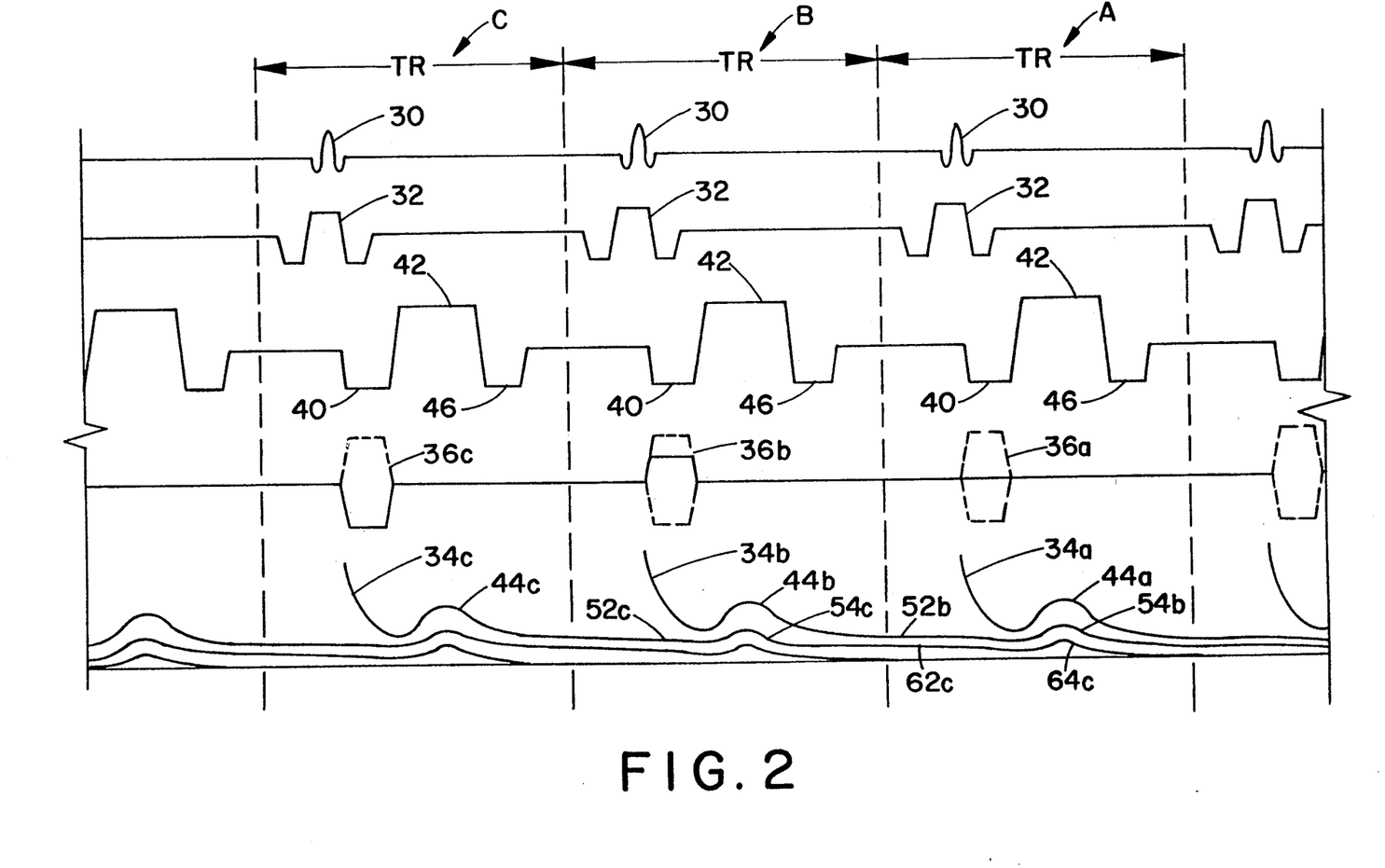
FIG. 2 is a diagrammatic illustration of a preferred imaging sequence in accordance with the present invention.

With reference to FIG. 2, in any given repetition A the central sequence computer 24 causes a low tip angle, preferably below 20°, RF pulse 30 to excite fresh resonance of selected dipoles of a subject in the examination region. A slice select pulse 32 is, preferably, applied concurrently with the RF pulse 30 in order to limit the excitation to a preselected slice of the subject. As will be appreciated from the following description, the present technique is equally applicable to volume imaging and need not be limited to a single slice. The RF pulse 30 induces a freshly excited or first generation magnetic resonance signal component 34a which has phase encoding $\phi$a added by a phase encoding gradient 36a. In the preferred embodiment, 256 data lines are generated, each with a different phase encoding. The data lines are phase encoded with zero phase encoding (no gradient) for the central-most view or data line. The phase encoding varies in equal increments with 127 phase encodings to one side of zero and 128 to the other. In this manner, 256 data lines are generated which are arranged symmetrically about the central phase encoding, $\phi=0$.

A read gradient is applied with a first polarity portion 40 and then reversed to a second polarity portion 42 to cause the freshly excited signal 34a to refocus into a first generation echo component 44a. A second first polarity read gradient pulse 46 is applied to refocus the magnetization such that residual phase dispersion is not caused in the read direction.

In a preceding repetition B, an RF pulse 30 induced a first generation resonance signal 34b. A phase encoding gradient 36b encoded the first generation signal 34b with a phase encoding $\phi$b. The reversal of the read gradient caused the first generation signal 34b to form a gradient echo component 44b. However, because the first generation component was not extinguished, it has persisted into the repetition A as a second generation component 52b encoded with phase $\phi$b.

In repetition A, the second generation residual magnetization 52b is also phase encoded by phase encode gradient 36a and becomes phase encoded with phase $\phi$b+$\phi$a. The read gradient reversal causes the second generation residual magnetization to form a second generation echo component 54b concurrently with the first generation echo component 44a.

In a next preceding repetition C, an RF pulse 30 induced a first generation resonance signal 34c. A phase encode gradient 36c encoded the first generation signal 34c with a phase encoding $\phi$c. The reversal of the read gradient caused the first generation signal 34c to form a first generation gradient echo component 44c. However, because the gradient echo component was not extinguished, it has persisted into the repetition B as a second generation component 52c encoded with phase encoding $\phi$c.

In repetition B, the second generation residual magnetization 52c was also phase encoded by phase encode gradient 36b and became phase encoded with phase $\phi$b+$\phi$c. The read gradient reversal caused the second generation residual magnetization to form a second generation echo component 54c concurrently with the first generation echo component 44b.

Because the first generation signal 44b and second generation signal 54c were not extinguished, they persist into repetition A as the second generation signal 52b with phase encoding $\phi$b and a third generation magnetization signal 62c with phase encoding $\phi$b+$\phi$c.

In repetition A, the third generation residual magnetization 62c is also phase encoded by gradient 36a and becomes phase encoded with phase $\phi$a+$\phi$b+$\phi$c. The read gradient reversal causes the third generation magnetization 62c to form a third generation echo component 64c concurrently with the second generation echo 54b and the first generation echo 44a. Analogously, fourth and higher order residual magnetization components persisting from preceding repetitions may be phase encoded and refocused into echo components.

For example, the phase encode gradient 36a may apply a zero phase encoding, $\phi$a=0. The preceding phase encode gradient 36b may have applied a phase encode gradient to encode an intermediate phase $\phi b=64$. The next preceding phase encode gradient 36c may have applied a phase encode gradient to encode a negative peripheral phase $\phi c=-127$. In this example, the first generation component 44a is encoded with phase $\phi a=0$; the second generation component 54b is encoded with phase $\phi a+\phi b=64$; and the third generation component 64c is encoded with phase $\phi a+\phi b+\phi c=0+64-127=-63$.

Although illustrated in terms of three generations, it is to be appreciated that fourth and higher generation magnetization may also be present in the induced echo. Thus, when the composite magnetic resonance echo signal is sampled during a read gradient, it is the sum of the first generation component 44a, a second generation component 54b, a third generation component 64c, and possibly components of additional generations.

With reference again to FIG. 11 the central sequence computer 24 provides the gradient field control with a preselected phase encode amount $\phi$ for each given repetition, as well as control signals for the slice select and read gradient which remain substantially identical from repetition to repetition. It is to be appreciated, that the phase encode gradients include both positive and negative gradients. Hence, when the gradients are summed, the difference in sign among the gradients tends to decrease or bring the gradient back towards zero as in the above illustration.

A component by component phase determining means 70 determines the phase $\phi_1$ of the freshly excited or first generation component 44a, the phase $\phi_2$ of the second generation component 54b, the phase $\phi_3$ of the third generation component 64c, and so forth for additional components. In the illustrated embodiment, the first generation phase encoding $\phi_1$ is the phase encode signal $\phi a$ from the central sequence computer 24. A one repetition delay means 72 delays or holds the phase $\phi a$ from the central sequence computer for one repetition. An adding means 74 adds the phase $\phi a$ from the current repetition with the encoded phase $\phi b$ of the preceding repetition to generate $\phi_2$. Another one repetition delay means 76 delays the sum one more repetition and an adding means 78 adds the current phase $\phi a$ to the sum of the encoded phase $\phi b+\phi c$ of the preceding and next preceding repetitions to generate the third generation component phase $\phi_3$.

Each digital data line from the receiver 22 is conveyed to and stored in the appropriate lines of a first generation data memory 80, a second generation data memory 82, and third generation data memory 84, and data memories for any higher generations as might be collected. More specifically, a distributing means 86 and the data memories 80, 82, 84 receive the first, second, and third generation phase encoding information $\phi_1$, $\phi_2$, $\phi_3$, from the phase determining means 70 such that each data line is stored in accordance with the corresponding one of phase encoding $\phi_1$, $\phi_2$, and $\phi_3$ in each of the corresponding memories. Note that the data lines in general will be stored corresponding to a different phase encoding in every memory. Each of the data space memories, in the illustrated embodiment, is a 256×256 memory. Each data line has 256 data values representing data along a frequency encode direction. Each memory is configured to store a central or zero phase encoded data line adjacent to its center. Data lines with phase encoding increments from $-1$ to $-127$ and data lines corresponding to phase encoding gradients from 1 to 128 in equal increments are stored in corresponding adjacent rows. In the example given above in which $\phi a=0$, $\phi b=64$, $\phi c=-127$, the sampled data line is stored concurrently in the $\phi=0$ position in the first generation data memory 80, the $\phi=64$ position in the second generation data memory 82, and the $\phi=-63$ position in the third generation data memory 84.

The phase encoding gradients which are applied in each repetition are selected such that after about 256 repetitions each of the data memories receives a data line corresponding to each of its 256 preassigned phase encoding steps. That is, $\phi_1$, $\phi_2$, and $\phi_3$ each assume each of the phase encode values from $-127$ through $+128$. Moreover, the phase encodings are selected such that in any given composite signal, when one of the components has a central phase encoding (near zero), the other components have a more peripheral phase encoding (toward $-127$ or $+128$).

When the data lines loaded in an image memory are reconstructed, the central data lines contribute most strongly to the resultant image. In the first generation data memory 80, the data lines are stored by the order of the phase encoding of the first generation component with the second and third generation components being treated as noise. That is, the data lines in which the first generation component 44 has central phase encoding are stored centrally in the first generation data memory 80. Thus, when the data is reconstructed, the resultant image is heavily weighted toward the first generation component, but somewhat noisy due to the presence of the second and third generation data.

Similarly, in the second generation data memory 82, the same data lines are arranged in order by the phase encoding of the second generation components. The data lines with the strongest centrally phase encoded second generation components 54 are arranged as the corresponding centrally phase encoded data lines or views of data space. When this data is reconstructed, the resultant image is weighted toward the second generation component, with the first and third generation components contributing noise.

Analogously, in the third generation data memory 84, the same data lines are arranged in order by the phase encoding of the third generation components 64. The data lines with the strongest centrally phase encoded third generation components are arranged as the corresponding centrally phase encoded data lines or views of data space. When this data is reconstructed, the resultant image is weighted toward the third generation component, with the first and second generation components contributing noise.

A correction means go estimates the contribution of each generation component to the data sets of the other generations and removes the estimated contribution. More specifically, a first cross contribution means 92 estimates the contribution of the first generation components to the data stored in the second and third generation data memories 82 and 84. This estimate is subtracted from the data in the second and third generation data memories. A second cross contribution means 94 estimates and subtracts the contribution of the second generation components from the data in the first and third generation data memories 80, 84. A third cross contribution means 96 estimates and subtracts the contribution of the third generation component from the data in the first and second generation data memories 80, 82.

It will be noted that the estimated contributions are based on data sets that have error or noise from the other components. After the first round of corrections, the data from each of the data memories has less noise or contribution from the other components, hence can be used to perform the correction process more accurately. Accordingly, a second iteration of the correction is preferably performed. Moreover, it is preferred that this correction procedure is repeated iteratively until each data set converges acceptably close to a data corresponding to only one of the components.

An image reconstruction means 98 performs a two-dimensional inverse Fourier transform on the corrected data to generate a first generation image representation which is stored in a first generation image memory 100, a second generation image representation which is stored in a second generation image memory 102, and a third generation image representation that is stored in a third generation image memory 104. Additional generations of images can be generated analogously and stored in corresponding image memories.

A video formatting means 106 receives the images from the image memories 100, 102, and 104 and formats them into the appropriate format for display on a monitor 108. Preferably, the video formatting means 106 formats the information to display a single one of the image representations or any combination of the image representations. Optionally, additional software may be provided for processing the image representations further, such as data for subtracting the resultant images, performing other image enhancements, and the like. Further, tape or disk storage is preferably provided for storing images.

Figure 3:
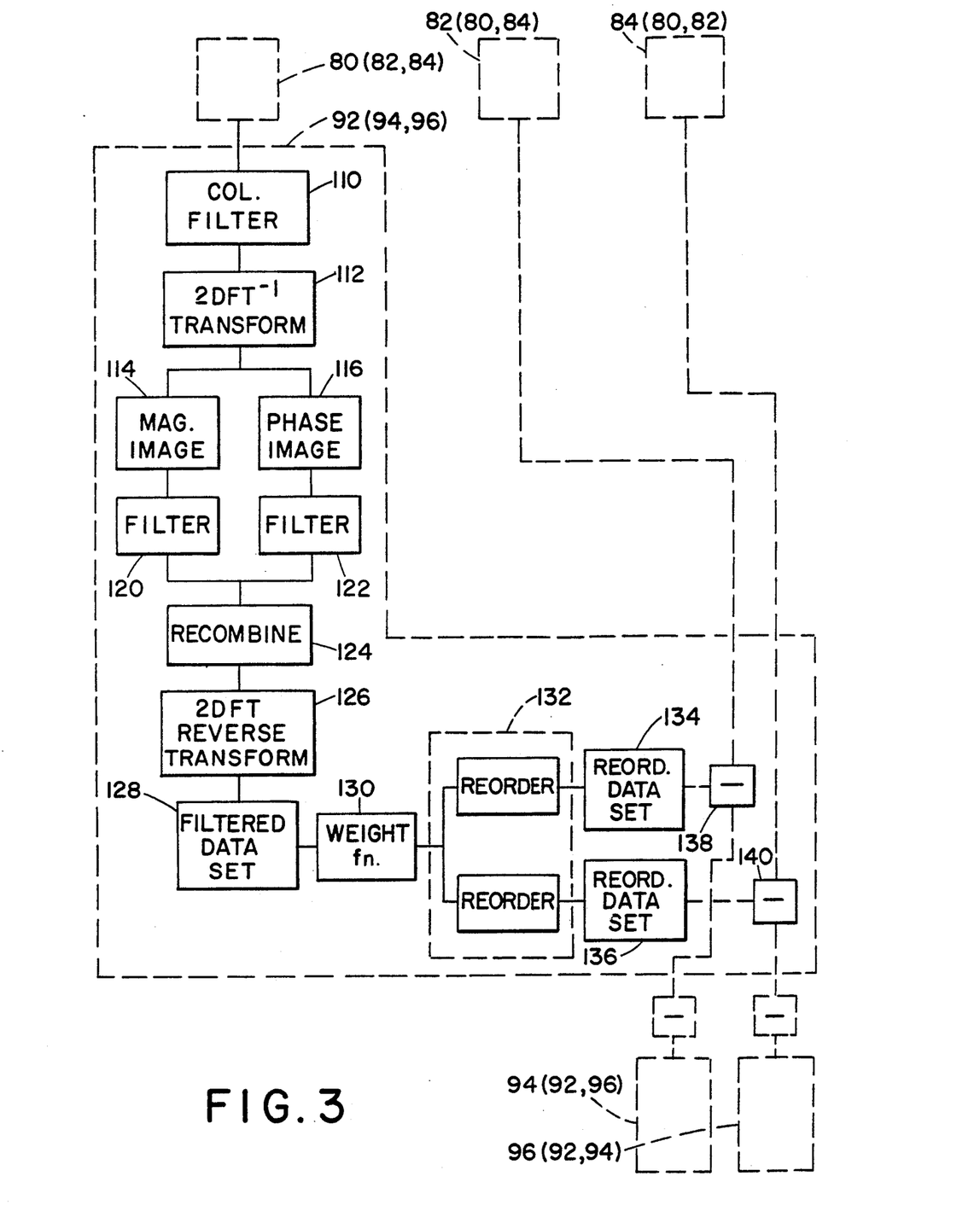
FIG. 3 is a diagrammatic illustration of the means for estimating the contributions of each component to the cumulative data lines; and, FIG. 4 illustrates another imaging sequence in accordance with the present invention.

With reference to FIG. 3, each of cross contribution estimating and correcting means 92, 94, 96 includes a column filter 110 which filters the data from the associated one of data memories 80, 82, 84 with a column filter that filters the peripheral data most heavily and the central data the least. This emphasizes the centrally ordered view hence the generation which controlled data line order in the data set and de-emphasizes the other generation components. A two-dimensional inverse Fourier transform means 112 reconstructs an image representation from the filtered data set. More specifically, a magnitude portion of the image is stored in a magnitude image memory means 114 and a phase portion of the image is stored in a phase image memory means 116. The magnitude and phase images are filtered. More specifically, a magnitude image filtering means 120 filters the magnitude image with a background filter to remove background clutter, and with an edge-preserving noise reducing filter, optionally, the magnitude image can be fit against the corresponding magnitude images from the other generation components. A phase image filtering means 122 filters the phase image representation with a mild smoothing function. A recombining means 124 recombines the filtered magnitude and phase images into a complete image. A two-dimensional Fourier transform means 126 reverse transforms the image representation into a corresponding data space data set that is stored in a filtered data set memory 128. A weighting function means 130 weights the generated data set. In the first generation correction, the weighting function 130 is preferably relatively small, e.g. around 0.5. A data line reordering means 132 reorders the data lines to match the data line order in the other generation data sets and stores the reordered data sets in memories 134 and 136. A subtracting means 138 subtracts each data line of the reordered data set from each corresponding data line of one of the other generation data sets, and a subtracting means 140 subtracts the other reordered data set from the corresponding other generation data set.

In a first iteration, estimated data line contributions from the other generations are not available. The cross correction means 92 operates directly on the data from the first generation data memory 80 to generate estimated data line corrections for the data from the second and third generation data memories 82, 84.

By the next iteration the cross correction means 94, 96 have estimated contributions of the second and third generation components to the data lines of the first generation image memory. The subtracting means 138 and 140 subtract these estimated contributions from the data from the first generation data memory 80 before the data is again processed by the cross correction means 92. In the second pass, the cross correction means 92 produces a better estimate of first generation component contribution to the data lines of the second and third generation data sets.

With this better estimate of the first generation components, the cross correction means 94 and 96 produce better estimates of the contributions of the second and third generation components. With the better contribution of the second and third generation components, the estimate of the first generation component becomes more accurate. This iterative correction process is repeated until the first, second, and third generation components are separated to a satisfactory degree. Once satisfactory separation is achieved, the separated data sets are reconstructed by reconstruction means 98 into separate images for each generation.

In each iteration,, the column filter 110 preferably filters less of the peripheral data. The weighting means 130 weights each estimated contribution more heavily.

Figure 4:
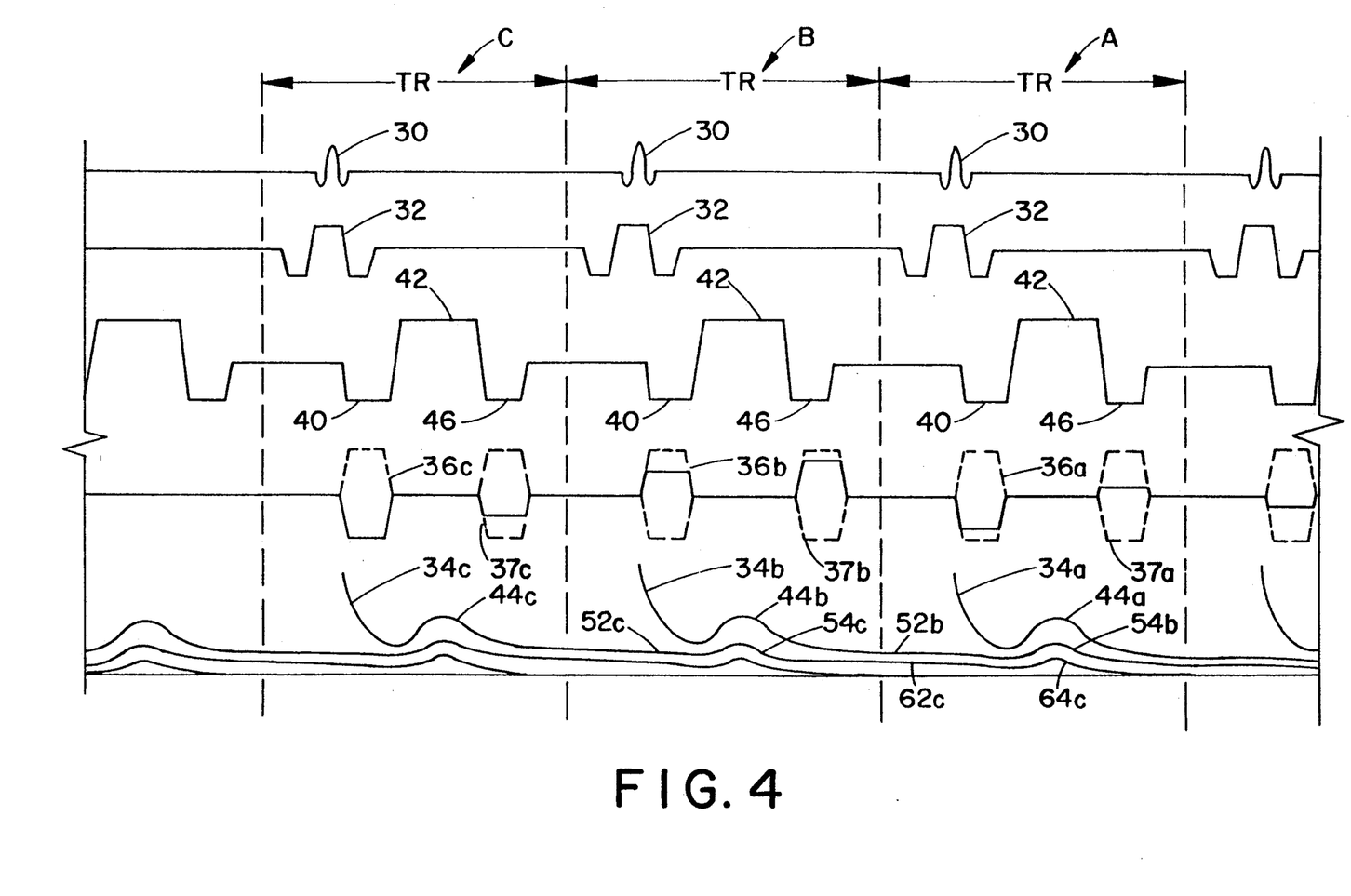

FIG. 4 depicts an alternate pulse sequence embodiment which differs from FIG. 2 in that it contains extra phase encode gradient portions 37a, 37b, 37c in each repetition. The purpose of these extra phase encode gradients is to ease the task of selecting phase encode amplitudes $\phi a$, $\phi b$, $\phi c$, etc. which satisfy the conditions for performing the method. These conditions include: (1) within a total number of repetitions N, the values of the phase encoding of the first component $\phi_1$ should take on all or nearly all of the values in the range of the raw data matrix. In the example of the preferred embodiment, $\phi_1$ ranges from $-127$ to $+128$, and N is preferably not much more than 256. (2) These same amplitudes $\phi a$, $\phi b$, $\phi c$, etc. generate cumulative phase encodings $\phi_2$, $\phi_3$, etc. for the second generation component,, third generation component, etc. which also substantially span the range of the image matrix. In the example of the preferred embodiment, N again spans views $-127$ to $+128$. (3) When the cumulative phase encoding of a given component is a central value (i.e. has a value near zero), the values of the same acquired data line of the cumulative phase encoding for other components are preferably not near zero. For example, if $\phi_2$ for a given repetition takes on a value in the range $-20$ to $+20$, it is preferred that the $\phi_1$, $\phi_3$, etc. have values outside the range of $-20$ to $+20$. (4) The sequence values for $\phi_1$, $\phi_2$, etc. are preferably highly disordered relative to each other, in the following sense. The data for any given signal component, when sorted for the appropriate effective phase encoding order, has a high degree of correlation and yields an image with large amounts of structure. That same signal component, if sorted according to the phase encode order of a different component, should yield a noisy structureless image, as opposed to a highly structured image.

It may be difficult to determine a set of phase encode amplitudes $\phi a$, $\phi b$, $\phi c$, etc. which simultaneously satisfy the noted previous conditions and others to an acceptable level.

The FIG. 4 embodiment eases the task of generating the sequences $\phi_1$, $\phi_2$, $\phi_3$, etc., and may allow the conditions (1)–(4) above to be accomplished more fully and more easily. To generate effective phase encodings, $\phi_1$, $\phi_2$, $\phi_3$, etc. which meet the desired conditions to acceptable levels, one may select the amplitudes of both phase encode (unwrap) gradients 36 and 37. In particular, suppose that in repetition B the phase encode gradient 37b has an amplitude $\psi b$, and in repetition C the phase encode gradient has an amplitude $\psi c$. Then the first generation signal 44a refocused in repetition A has its phase encoded by the amount $\phi_1 = \phi a$. The second generation signal 54b which occurs in repetition A has its phase encoded by the amount $\phi_2 = \phi a + \psi b + \phi b$. The third generation signal 64c has its phase encoded by the amount $\phi_3 = \phi a + \psi b + \phi b + \psi c + \phi c$.

One useful choice of amplitudes $\psi a$, $\psi b$, $\psi c$ for the additional phase encode gradients 37a, 37b, 37c is to select each amplitude to be the negative of the amplitude of the phase encode gradient 36 which it immediately precedes. That is $\psi b = -\phi a$, $\psi c = -\phi b$, and so forth. An advantage of this choice is that the sequence of values $\phi_2$ takes on the same sequence of values as $\phi_1$, except that second generation signal component with a given phase encode amplitude appears one repetition later than the first generation signal component which has the same phase encoding amplitude. Similarly, the third generation signal also undergoes the same sequence of phase encoding values, except that these values are delayed by one repetition relative to the second generation signal, and are delayed by two repetitions relative to the sequence of phase encodings of the first generation signal.

Advantages of this specific choice of amplitudes for the $\psi$ include: (1) if the sequence of $\phi$'s fully covers the range of desired phase encoding values, then the $\phi_2$ and $\phi_3$ sequences also cover that entire range (with the possible exception that one extra repetition is needed to collect the last value of $\phi_2$ and another extra repetition is needed to collect the last value of $\phi_3$, and so forth); and (2) the means for determining the sorting of the data views for each component is simplified, because each higher generation phase encoding sequence is just a delayed version of the previous generation's phase encoding sequence.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of generating at least one image representation from first and prior generation magnetic resonance data, the method comprising:

a) in the presence of a phase encoded, prior generation magnetic resonance component from a preceding repetition, exciting a first generation magnetic resonance component;

b) applying a phase encoding gradient to phase encode the first generation magnetic resonance component and modify the phase encoding of the prior generation magnetic resonance component;

c) sampling a composite magnetic resonance signal which is a superimposition of at least the first and prior generation magnetic resonance components;

d) allowing at least the phase encoded first generation component to persist into a subsequent repetition as a phase encoded prior generation magnetic resonance component;

e) repeating steps (a)–(d) with each of a plurality of phase encode gradients;

f) assembling the sampled composite data lines into a first generation data set in which the composite data lines are organized in accordance with the phase encoding of the first generation magnetic resonance component;

g) assembling the sampled composite data lines into a prior generation magnetic resonance data set in which the composite data lines are organized in accordance with the phase encoding of the prior generation magnetic resonance component;

h) from the prior generation magnetic resonance data set, estimating a contribution of the prior generation magnetic resonance components to the first generation data set and correcting the first generation data set with the estimated contribution;

i) reconstructing a first generation image representation from the corrected first generation data set.

2. The method as set forth in claim 1 further including:

j) from the first generation data set, estimating a contribution of the first generation magnetic resonance components to the prior generation data set and correcting the prior generation data set with the estimated contribution.

3. The method as set forth in claim 2 further including:

reconstructing a prior generation magnetic resonance image representation from the corrected prior generation data set.

4. The method as set forth in claim 2 further including:

iteratively repeating steps (h) and (j) before reconstructing the first generation image representation.

5. The method as set forth in claim 4 further including:

reconstructing a prior generation magnetic resonance image representation from the iteratively corrected prior generation data set.

6. The method as set forth in claim 1 wherein estimating step (h) includes:

transforming the prior generation data set into a prior generation intermediate image representation;

filtering the prior generation intermediate image representation;

reverse transforming the filtered prior generation intermediate image representation into the estimated prior generation contribution.

7. The method as set forth in claim 6 wherein the filtering step includes:

filtering a magnitude portion of the prior generation intermediate image representation to reduce background and enhance edges; and filtering a phase portion of the prior generation intermediate image representation with a smoothing filter.

8. The method as set forth in claim 7 wherein the estimating step (h) further includes:
filtering the prior generation data set prior to the transforming step.

9. The method as set forth in claim 1 further including after step (c) and before step (e), applying a further phase encode gradient to alter the phase encoding of the first and prior generation magnetic resonance components.

10. The method as set forth in claim 9 wherein the further phase encode gradient is a negative of the phase encode gradient applied in the next repetition of step (e).

11. A magnetic resonance imaging method comprising:
   a) collecting a plurality of composite magnetic resonance data lines, each composite data line including a first component with a first phase encoding and a second component with a second phase encoding;
   b) assembling the sampled composite data lines into a first data set in which the composite data lines are organized in accordance with the phase encoding of the first component;
   c) assembling the sampled composite data lines into a second data set in which the composite data lines are organized in accordance with the phase encoding of the second component;
   d) from the first data set, estimating a contribution of the first components to the second data set and correcting the second data set with the estimated first component contribution;
   e) from the second data set, estimating a contribution of the second components to the first data set and correcting the first data set with the estimated second component contribution;
   f) reconstructing a first image representation from the corrected first data set.

12. The method as set forth in claim 11 further including:
iteratively repeating steps (d) and (e) before reconstructing the first image representation.

13. The method as set forth in claim 12 further including:
reconstructing a second image representation from the corrected second data set.

14. The method as set forth in claim 13 wherein the estimating steps each include:
transforming one of the data sets into an intermediate image representation having a magnitude portion and a phase portion;
filtering the magnitude portion to reduce background and enhance edges;
filtering a phase portion with a smoothing filter;
reverse transforming the filtered intermediate image representation magnitude and phase portions into the estimated contribution.

15. A method of magnetic resonance imaging selected dipoles comprising:
repeatedly applying a magnetic resonance sequence such that its repeat time is shorter than a T2 relaxation time of the selected dipoles and such that a sampled resonance data line in each repetition has a freshly excited component and at least one residual magnetic resonance component from a preceding repetition of the magnetic resonance sequence the freshly excited and residual components being independently phase encoded;
reconstructing the independently phase encoded freshly excited and residual components into separate image representations.

16. The method as set forth in claim 15 further including:
assembling the sampled data lines into a first data set in which the data lines are organized in accordance with the phase encoding of the freshly excited components;
assembling the sampled composite data lines into a second data set in which the data lines are organized in accordance with the phase encoding of the residual components;
from the first data set, estimating a contribution of the freshly excited components to the second data set and correcting the second data set with the estimated freshly excited component contribution;
from the second data set, estimating a contribution of the residual components to the first data set and correcting the first data set with the estimated residual component contribution.

17. An apparatus for generating at least one image representation from first and prior generation magnetic resonance data, the apparatus comprising:
a resonance excitation means for repeatedly exciting a first generation magnetic resonance component in the presence of a previously phase encoded prior generation magnetic resonance component from a preceding repetition;
a phase encoding means for applying a phase encoding gradient to phase encode the first generation component and to modify the phase encoding of the prior generation component;
a sampling means for sampling a composite resonance signal which is superimposition of at least the first and prior generation components;
a first generation data set memory means for storing the sampled composite magnetic resonance signals;
a prior generation data set memory means for storing the sampled composite magnetic resonance signals;
a distributing means for distributing the sampled composite magnetic resonance signals for storage in the first generation data set memory means in accordance with the phase encoding of the first generation component and for storage in the prior generation data set memory means in accordance with the phase encoding of the prior generation component;
a correcting means for correcting the composite magnetic resonance signals stored in one of the first and prior generation data set memory means in accordance with the composite magnetic resonance signals stored in the other;
a reconstructing means for reconstructing the corrected magnetic resonance signals into an image representation.

18. The apparatus as set forth in claim 17 wherein the correcting means corrects the composite magnetic resonance signals in the first generation data set memory means in accordance with the composite magnetic resonance signals in the prior generation data set memory means and corrects the composite magnetic resonance signals in the prior generation data set memory means in accordance with the composite magnetic resonance signals in the first generation data set memory means and further including:
a first generation image memory means for storing a first generation image representation, the reconstructing means reconstructing the corrected composite magnetic resonance signals from the first generation data set memory means into the first generation image representation; and a prior generation image memory means, the reconstructing means reconstructing the corrected composite magnetic resonance signals from the prior generation data set memory means into the second generation image representation.

19. The apparatus as set forth in claim 17 wherein the correcting means includes a cross contribution correcting means for correcting the contribution of the composite magnetic resonance signals stored in one of the first and prior generation data set memory means in accordance with the composite magnetic resonance signals from the other of the first and prior generation data set memory means, the cross information correcting means including:

a transforming means for transforming the data lines of one of the data sets into an intermediate image representation;

a filtering means for filtering the intermediate image representation;

a reverse transform means for reverse transforming the filtered intermediate image representation into an estimated contribution of the one data set to the other; and a subtracting means for subtracting the estimated contribution from the other data set.

20. A magnetic resonance image apparatus comprising:

a magnetic resonance scanner for generating a plurality of data lines, each data line including a first component with a first phase encoding and a second component with a second phase encoding, the second phase encoding being different from the first phase encoding;

a first data set memory means for storing the data lines;

a second data set memory means for storing the data lines;

a distributing means for causing the first data set memory means to store the data lines in an order in accordance with the phase encoding of the first component and for causing the second data set memory means to store each data line in accordance with the phase encoding of the second component;

a correcting means for correcting the data lines in at least one of the first and second data set memory means in accordance with the data lines in the other data set memory means;

a reconstructing means for reconstructing the corrected data lines of at least one of the data set memory means into an image representation for storage in an image memory.

21. The apparatus as set forth in claim 20 wherein the correcting means includes:

a first correcting means for correcting the data lines of the second data memory means in accordance with the data lines stored in the first data set memory means; and a second correcting means for correcting the data lines of the first data set memory means in accordance with the data lines of the second data set memory means.

22. The apparatus as set forth in claim 21 wherein the first and second correcting means each include:

a transforming means for transforming the data lines of one of the data sets into an intermediate image representation;

a filtering means for filtering the intermediate image representation;

a reverse transform means for reverse transforming the filtered intermediate image representation into an estimated contribution of the one data set to the other; and a subtracting means for subtracting the estimated contribution of one data set from the other data set.

* * * * *